United States Patent
Acharya et al.

(10) Patent No.: US 7,190,287 B2
(45) Date of Patent: Mar. 13, 2007

(54) METHOD OF GENERATING HUFFMAN CODE LENGTH INFORMATION

(75) Inventors: Tinku Acharya, Chandler, AZ (US); Ping-Sing Tsai, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/296,016

(22) Filed: Dec. 6, 2005

(65) Prior Publication Data

US 2006/0087460 A1    Apr. 27, 2006

Related U.S. Application Data

(63) Continuation of application No. 10/454,553, filed on Jun. 3, 2003, now Pat. No. 6,987,469, which is a continuation of application No. 09/704,392, filed on Oct. 31, 2000, now Pat. No. 6,636,167.

(51) Int. Cl.
*H03M 7/40*    (2006.01)

(52) U.S. Cl. .......................... 341/65; 341/67

(58) Field of Classification Search .......... 341/50–100, 341/106
See application file for complete search history.

(56) References Cited

U.S. PATENT DOCUMENTS

| | | | |
|---|---|---|---|
| 4,813,056 A | 3/1989 | Fedele | |
| 4,899,149 A | 2/1990 | Kahan | |
| 5,467,088 A | 11/1995 | Kinouchi et al. | |
| 5,778,371 A | 7/1998 | Fujihara | |
| 5,875,122 A | 2/1999 | Acharya | |
| 5,973,627 A | 10/1999 | Bakhmutsky | |
| 5,995,210 A | 11/1999 | Acharya | |
| 6,009,201 A | 12/1999 | Acharya | |
| 6,009,206 A | 12/1999 | Acharya | |
| 6,040,790 A | 3/2000 | Law | |
| 6,047,303 A | 4/2000 | Acharya | |
| 6,075,470 A | 6/2000 | Little et al. | |
| 6,091,851 A | 7/2000 | Acharya | |
| 6,094,508 A | 7/2000 | Acharya et al. | |
| 6,108,453 A | 8/2000 | Acharya | |
| 6,124,811 A | 9/2000 | Acharya et al. | |
| 6,130,960 A | 10/2000 | Acharya | |
| 6,151,069 A | 11/2000 | Dunton et al. | |

(Continued)

FOREIGN PATENT DOCUMENTS

EP    0 907 288 A2    4/1999

(Continued)

OTHER PUBLICATIONS

Shih-Fu Chang and David G. Messerschmitt, "VLSI Designs for High-Speed Huffman Decoder," IEEE, pp. 500-503, USA, "no month" "no year".

(Continued)

*Primary Examiner*—Rexford Barnie
*Assistant Examiner*—Lam T. Mai
(74) *Attorney, Agent, or Firm*—Libby H. Hope

(57) ABSTRACT

Embodiments of a method of generating Huffman code length information are disclosed. In one such embodiment, a data structure is employed, although, of course, the invention is not limited in scope to the particular embodiments disclosed.

14 Claims, 4 Drawing Sheets

| Group Frequency | Member of symbol in bit-flag form (bit 15 ————— bit 0) |
|---|---|
| 8 | 00000000 00000001 |
| 5 | 00000000 00000010 |
| 4 | 00000000 00000100 |
| 3 | 00000000 00001000 |
| 2 | 00000000 00010000 |
| 2 | 00000000 00100000 |
| 2 | 00000000 01000000 |
| 2 | 00000000 10000000 |
| 2 | 00000001 00000000 |
| 1 | 00000010 00000000 |
| 1 | 00000100 00000000 |
| 1 | 00001000 00000000 |
| 1 | 00010000 00000000 |
| 1 | 00100000 00000000 |
| 1 | 01000000 00000000 |
| 1 | 10000000 00000000 |

U.S. PATENT DOCUMENTS

| | | |
|---|---|---|
| 6,151,415 A | 11/2000 | Acharya et al. |
| 6,154,493 A | 11/2000 | Acharya et al. |
| 6,166,664 A | 12/2000 | Acharya |
| 6,178,269 B1 | 1/2001 | Acharya |
| 6,195,026 B1 | 2/2001 | Acharya |
| 6,215,908 B1 | 4/2001 | Pazmino et al. |
| 6,215,916 B1 | 4/2001 | Acharya |
| 6,229,578 B1 | 5/2001 | Acharya et al. |
| 6,233,358 B1 | 5/2001 | Acharya |
| 6,236,433 B1 | 5/2001 | Acharya et al. |
| 6,236,765 B1 | 5/2001 | Acharya |
| 6,269,181 B1 | 7/2001 | Acharya |
| 6,275,206 B1 | 8/2001 | Tsai et al. |
| 6,285,796 B1 | 9/2001 | Acharya et al. |
| 6,292,114 B1* | 9/2001 | Tsai et al. ............... 341/67 |
| 6,292,144 B1 | 9/2001 | Taflove et al. |
| 6,301,392 B1 | 10/2001 | Acharya |
| 6,348,929 B1 | 2/2002 | Acharya |
| 6,351,555 B1 | 2/2002 | Acharya et al. |
| 6,356,276 B1 | 3/2002 | Acharya |
| 6,366,692 B1 | 4/2002 | Acharya |
| 6,366,694 B1 | 4/2002 | Acharya |
| 6,373,481 B1 | 4/2002 | Tan et al. |
| 6,377,280 B1 | 4/2002 | Acharya et al. |
| 6,381,357 B1 | 4/2002 | Tan et al. |
| 6,392,699 B1 | 5/2002 | Acharya |
| 6,449,380 B1 | 9/2002 | Acharya et al. |
| 6,535,648 B1 | 3/2003 | Acharya |
| 6,556,242 B1 | 4/2003 | Dunton et al. |
| 6,563,439 B1* | 5/2003 | Acharya et al. ........... 341/65 |
| 6,563,948 B2 | 5/2003 | Tan et al. |
| 6,574,374 B1 | 6/2003 | Acharya |
| 6,600,833 B1 | 7/2003 | Tan et al. |
| 6,608,912 B2 | 8/2003 | Acharya et al. |
| 6,625,308 B1 | 9/2003 | Acharya et al. |
| 6,625,318 B1 | 9/2003 | Tan et al. |
| 6,628,716 B1 | 9/2003 | Tan et al. |
| 6,628,827 B1 | 9/2003 | Acharya |
| 6,633,610 B2 | 10/2003 | Acharya |
| 6,636,167 B1 | 10/2003 | Acharya et al. |
| 6,639,691 B2 | 10/2003 | Acharya |
| 6,640,017 B1 | 10/2003 | Tsai et al. |
| 6,646,577 B2 | 11/2003 | Acharya et al. |
| 6,650,688 B1 | 11/2003 | Acharya et al. |
| 6,653,953 B2 | 11/2003 | Becker et al. |
| 6,654,501 B1 | 11/2003 | Acharya et al. |
| 6,658,399 B1 | 12/2003 | Acharya et al. |
| 6,662,200 B2 | 12/2003 | Acharya |
| 6,678,708 B1 | 1/2004 | Acharya |
| 6,681,060 B2 | 1/2004 | Acharya et al. |
| 6,690,306 B1 | 2/2004 | Acharya et al. |
| 6,694,061 B1 | 2/2004 | Acharya |
| 6,697,534 B1 | 2/2004 | Tan et al. |
| 6,707,928 B2 | 3/2004 | Acharya et al. |
| 6,725,247 B2 | 4/2004 | Acharya |
| 6,731,706 B1 | 5/2004 | Acharya et al. |
| 6,731,807 B1 | 5/2004 | Pazmino et al. |
| 6,738,520 B1 | 5/2004 | Acharya et al. |
| 6,748,118 B1 | 6/2004 | Acharya et al. |
| 6,751,640 B1 | 6/2004 | Acharya |
| 6,757,430 B2 | 6/2004 | Metz et al. |
| 6,759,646 B1 | 7/2004 | Acharya et al. |
| 6,766,286 B2 | 7/2004 | Acharya |
| 6,775,413 B1 | 8/2004 | Acharya |
| 6,795,566 B2 | 9/2004 | Acharya et al. |
| 6,795,592 B2 | 9/2004 | Acharya et al. |
| 6,798,901 B1 | 9/2004 | Acharya et al. |
| 6,813,384 B1 | 11/2004 | Acharya et al. |
| 6,825,470 B1 | 11/2004 | Bawolek et al. |
| 6,834,123 B2 | 12/2004 | Acharya et al. |
| 2002/0063789 A1 | 5/2002 | Acharya et al. |
| 2002/0063899 A1 | 5/2002 | Acharya et al. |
| 2002/0101524 A1 | 8/2002 | Acharya |
| 2002/0118746 A1 | 8/2002 | Kim et al. |
| 2002/0122482 A1 | 9/2002 | Hyun et al. |
| 2002/0161807 A1 | 10/2002 | Acharya |
| 2002/0174154 A1 | 11/2002 | Acharya |
| 2002/0181593 A1 | 12/2002 | Acharya et al. |
| 2003/0021486 A1 | 1/2003 | Acharya |
| 2003/0053666 A1 | 3/2003 | Acharya et al. |
| 2003/0063782 A1 | 4/2003 | Acharya et al. |
| 2003/0067988 A1 | 4/2003 | Kim et al. |
| 2003/0072364 A1 | 4/2003 | Kim et al. |
| 2003/0108247 A1 | 6/2003 | Acharya |
| 2003/0123539 A1 | 7/2003 | Kim et al. |
| 2003/0126169 A1 | 7/2003 | Wang et al. |
| 2003/0174077 A1 | 9/2003 | Acharya et al. |
| 2003/0194008 A1 | 10/2003 | Acharya et al. |
| 2003/0194128 A1 | 10/2003 | Acharya et al. |
| 2003/0210164 A1 | 11/2003 | Acharya et al. |
| 2004/0017952 A1 | 1/2004 | Acharya et al. |
| 2004/0022433 A1 | 2/2004 | Acharya et al. |
| 2004/0042551 A1 | 3/2004 | Acharya et al. |
| 2004/0047422 A1 | 3/2004 | Acharya et al. |
| 2004/0057516 A1 | 3/2004 | Kim et al. |
| 2004/0057626 A1 | 3/2004 | Acharya et al. |
| 2004/0071350 A1 | 4/2004 | Acharya et al. |
| 2004/0080513 A1 | 4/2004 | Acharya |
| 2004/0146208 A1 | 7/2004 | Pazmino et al. |
| 2004/0158594 A1 | 8/2004 | Acharya |
| 2004/0169748 A1 | 9/2004 | Acharya |
| 2004/0169749 A1 | 9/2004 | Acharya |
| 2004/0172433 A1 | 9/2004 | Acharya et al. |
| 2004/0174446 A1 | 9/2004 | Acharya |
| 2004/0240714 A1 | 12/2004 | Acharya et al. |

FOREIGN PATENT DOCUMENTS

| | | |
|---|---|---|
| EP | 1 195 934 | 4/2002 |
| GB | 2 367 223 | 3/2002 |
| GB | 2 378 361 | 2/2003 |
| KR | 1999-0081316 | 11/1999 |
| WO | WO 97/35383 | 9/1997 |
| WO | WO 02/37687 A2 | 5/2002 |
| WO | WO 02/037687 A3 | 5/2002 |

OTHER PUBLICATIONS

Seong Hwan Cho, et al., "Design of Low Power Variable Length Decoder Using Fine Grain Non-Uniform Table Partitioning," IEEE, 1997, pp. 2156-2159 USA, "no month".

Daniel S. Hirschberg and Debra A. Lelewer, "Efficient Decoding of Prefix Codes," Communications of the ACM, Apr. 1990, 99.449-458, No. 4, New York, USA.

Amar Mukherjee, et al., "Marvle: A VLSI Chip for Data Compression Using Tree-Based Codes," IEEE Transactions on Very Large Scale Integration (VLSI) Systems, Jun. 1993, pp. 203-214, No. 2, New York, USA.

Yasushi Ooi, et al., "A 162Mbit/s Variable Length Decoding Circuit Using An Adaptive Tree Search Technique,"IEEE, 1994 Custom Integrated Circuits Conference, pp. 107-110, USA, "no month" "no year".

Tinku Acharya, "SAD Computation Architecture," U.S. Appl. No. 09/677,829, filed Sep. 29, 2000, pp. 1-20, Figures 1-4.

Tinku Acharya, "SAD Computation Architecture," U.S. Appl. No. 09/677,830, filed Sep. 29, 2000, pp. 1-23, Figures 1-4.

Tinku Acharya, et al., "Wavelet Coding of Video", U.S. Appl. No. 09/722,988, filed Nov. 27, 2000, pp. 1-31, Figures 1-11.

Tinku Acharya, et al., "Method of Video Coding the Movement of A Human Face from A Sequence of Iamges", U.S. Appl. No. 09/608,989, filed Jun. 30, 2000, pp. 1-2, Figures 1-2.

Tinku Acharya, et al., "Method of Video Coding Shoulder Movement from A Sequence of Images," U.S. Appl. No. 09/607,724, filed Jun. 30, 2000, pp. 1-1, Figures 1-3.

Tinku Acharya, et al., "Method of Inverse Quantizing Quantized Signal Samples of an Image During Image Decompression," U.S. Appl. No. 09/507,213, filed Feb. 18, 2000, pp. 1-26, Figures: 1-6.

Tinku Acharya, et al., "Method of Using Hue to Interpolate Color Pixel Signals," U.S. Appl. No. 09/591,867, filed Jun. 12, 2000, pp. 1-15.

Hyun M. Kim, et al., "Method of Performing Motion Estimation," U.S. Appl. No. 09/596,127, filed Jun. 16, 2000, pp. 1-24, Figures: 1-5.

Tinku Acharya, "Discrete Filter," U.S. Appl. No. 09/432,337, filed Nov. 2, 1999, pp. 1-12, Figures: 1-12.

George J. Miao, et al., "Dual Mode Filter for Mobile Telecommunications," U.S. Appl. No. 09/467,611, filed Dec. 20, 1999, pp. 1-31, Figures: 1-24.

Tinku Acharya, et al., "Method of Interpolating Color Pixel Signals from A Subsampled Color Image," U.S. Appl. No. 09/410,800, filed Oct. 1, 1999, pp. 1-19, Figures: 1-4.

Tinku Acharya, "Method of Converting A Sub-Sampled Color Image," U.S. Appl. No. 09/461,068, filed Dec. 14, 1999, pp. 1-18, Figures: 1-4.

Tinku Acharya, et al., "Image Processing Method and Apparatus," U.S. Appl. No. 09/359,523, filed Jul. 23, 1999, pp. 1-12, Figures: 1-5.

Tinku Acharya, et al., "Computing the Euler Number of A Binary Image," U.S. Appl. No. 09/722,982, filed Nov. 27, 2000, pp. 1-22, Figures: 1-10.

Tinku Acharya, et al., "Developing an Euler Vectro for Images," U.S. Appl. No. 09/722,979, filed Nov. 27, 2000, pp. 1-29, Figures: 1-18.

Bhargab B. Bhattacharya, et al., "Fingerprint Minutiae Matching Using Scoring Techniques," U.S. Appl. No. 10/734,335, filed Dec. 11, 2003, pp. 1-26, Figures: 1-12.

Bhargab B. Bhattacharya, et al., "Robust Digital Image Watermarking Utilizing A Walsh Transform Algorithm," U.S. Appl. No. 10/734,691, filed Dec. 11, 2003, pp. 1-31, Figures: 1-18D.

Tinku Acharya, et al., "Searching for Object Images with Reduced Computation," U.S. Appl. No. 10/643,467, filed Aug. 19, 2003, pp. 1-22.

Ajoy K. Ray, et al., "Enabling Content-Based Search of Objects in an Image Database with Reduced Matching," U.S. Appl. No. 10/643,672, filed Aug. 19, 2003, pp. 1-22.

* cited by examiner

| Index | Symbols | Frequency (count) |
|---|---|---|
| 0 | a | 2 |
| 1 | b | 3 |
| 2 | c | 1 |
| 3 | d | 1 |
| 4 | e | 2 |
| 5 | f | 1 |
| 6 | g | 2 |
| 7 | h | 0 |
| 8 | i | 4 |
| 9 | j | 8 |
| 10 | k | 1 |
| 11 | l | 1 |
| 12 | m | 2 |
| 13 | n | 0 |
| 14 | o | 1 |
| 15 | p | 2 |
| 16 | q | 5 |
| 17 | r | 1 |

Figure 1

| entry number | Symbol Index (frequency) | Length |
|---|---|---|
| 0 | 9 (8) | 0 |
| 1 | 16 (5) | 0 |
| 2 | 8 (4) | 0 |
| 3 | 1 (3) | 0 |
| 4 | 15 (2) | 0 |
| 5 | 12 (2) | 0 |
| 6 | 6 (2) | 0 |
| 7 | 4 (2) | 0 |
| 8 | 0 (2) | 0 |
| 9 | 17 (1) | 0 |
| 10 | 14 (1) | 0 |
| 11 | 11 (1) | 0 |
| 12 | 10 (1) | 0 |
| 13 | 5 (1) | 0 |
| 14 | 3 (1) | 0 |
| 15 | 2 (1) | 0 |

Figure 2

| Group Frequency | Member of symbol in bit-flag form (bit 15 ------------------ bit 0) |
|---|---|
| 8 | 00000000 00000001 |
| 5 | 00000000 00000010 |
| 4 | 00000000 00000100 |
| 3 | 00000000 00001000 |
| 2 | 00000000 00010000 |
| 2 | 00000000 00100000 |
| 2 | 00000000 01000000 |
| 2 | 00000000 10000000 |
| 2 | 00000001 00000000 |
| 1 | 00000010 00000000 |
| 1 | 00000100 00000000 |
| 1 | 00001000 00000000 |
| 1 | 00010000 00000000 |
| 1 | 00100000 00000000 |
| 1 | 01000000 00000000 |
| 1 | 10000000 00000000 |

Figure 3

| entry number | Symbol Index (frequency) | Length |
|---|---|---|
| 0 | 9 (8) | 0 |
| 1 | 16 (5) | 0 |
| 2 | 8 (4) | 0 |
| 3 | 1 (3) | 0 |
| 4 | 15 (2) | 0 |
| 5 | 12 (2) | 0 |
| 6 | 6 (2) | 0 |
| 7 | 4 (2) | 0 |
| 8 | 0 (2) | 0 |
| 9 | 17 (1) | 0 |
| 10 | 14 (1) | 0 |
| 11 | 11 (1) | 0 |
| 12 | 10 (1) | 0 |
| 13 | 5 (1) | 0 |
| 14 | 3 (1) | 1 |
| 15 | 2 (1) | 1 |

Figure 4

| Group Frequency | Member of symbol in bit-flag form (bit 15 ---------------- bit 0) |
|---|---|
| 8 | 00000000 00000001 |
| 5 | 00000000 00000010 |
| 4 | 00000000 00000100 |
| 3 | 00000000 00001000 |
| 2 | 00000000 00010000 |
| 2 | 00000000 00100000 |
| 2 | 00000000 01000000 |
| 2 | 00000000 10000000 |
| 2 | 00000001 00000000 |
| 2 | 11000000 00000000 |
| 1 | 00000010 00000000 |
| 1 | 00000100 00000000 |
| 1 | 00001000 00000000 |
| 1 | 00010000 00000000 |
| 1 | 00100000 00000000 |
| ~~1~~ | ~~01000000 00000000~~ |
| ~~1~~ | ~~10000000 00000000~~ |

Figure 5

| Group Frequency | Member of symbol in bit-flag form (bit 15 ---------------- bit 0) |
|---|---|
| 37 | 11111111 11111111 |

Figure 6

| entry number | Symbol Index (frequency) | Length |
| --- | --- | --- |
| 0 | 9 (8) | 2 |
| 1 | 16 (5) | 3 |
| 2 | 8 (4) | 3 |
| 3 | 1 (3) | 4 |
| 4 | 15 (2) | 4 |
| 5 | 12 (2) | 5 |
| 6 | 6 (2) | 5 |
| 7 | 4 (2) | 4 |
| 8 | 0 (2) | 4 |
| 9 | 17 (1) | 5 |
| 10 | 14 (1) | 6 |
| 11 | 11 (1) | 6 |
| 12 | 10 (1) | 5 |
| 13 | 5 (1) | 5 |
| 14 | 3 (1) | 5 |
| 15 | 2 (1) | 5 |

Figure 7

METHOD OF GENERATING HUFFMAN CODE LENGTH INFORMATION

This application is a continuation application of U.S. application Ser. No. 10/454,553, entitled "Method of Generating Huffman Code Length Information", filed Jun. 3, 2003 (now U.S. Pat. No. 6,987,469, issued on Jan. 17, 2006), which is a continuation application of U.S. application Ser. No. 09/704,392, entitled "Method of Generating Huffman Code Length Information", filed Oct. 31, 2000 (now U.S. Pat. No. 6,636,167, issued on Oct. 21, 2003.)

RELATED APPLICATION

This patent application is related to concurrently filed U.S. patent application Ser. No. 09/704,380, titled "A Method of Performing Huffman Decoding," by Acharya et al., assigned to the assignee of the present invention and herein incorporated by reference.

BACKGROUND

The present disclosure is related to Huffman coding.

As is well-known, Huffman codes of a set of symbols are generated based at least in part on the probability of occurrence of source symbols. A binary tree, commonly referred to as a "Huffman Tree" is generated to extract the binary code and the code length. See, for example, D. A. Huffman, "A Method for the Construction of Minimum—Redundancy Codes," Proceedings of the IRE, Volume 40 No. 9, pages 1098 to 1101, 1952. D. A. Huffman, in the aforementioned paper, describes the process this way:

List all possible symbols with their probabilities;
Find the two symbols with the smallest probabilities;
Replace these by a single set containing both symbols, whose probability is the sum of the individual probabilities;
Repeat until the list contains only one member.

This procedure produces a recursively structured set of sets, each of which contains exactly two members. It, therefore, may be represented as a binary tree ("Huffman Tree") with the symbols as the "leaves." Then to form the code ("Huffman Code") for any particular symbol: traverse the binary tree from the root to that symbol, recording "0" for a left branch and "1" for a right branch. One issue, however, for this procedure is that the resultant Huffman tree is not unique. One example of an application of such codes is text compression, such as GZIP. GZIP is a text compression utility, developed under the GNU (Gnu's Not Unix) project, a project with a goal of developing a "free" or freely available UNIX-like operation system, for replacing the "compress" text compression utility on a UNIX operation system. See, for example, Gailly, J. L. and Adler, M., GZIP documentation and sources, available as gzip-1.2.4.tar at the website "http://www.gzip.orh/". In GZIP, Huffman tree information is passed from the encoder to the decoder in terms of a set of code lengths along with compressed text. Both the encoder and decoder, therefore, generate a unique Huffman code based upon this code-length information. However, generating length information for the Huffman codes by constructing the corresponding Huffman tree is inefficient. In particular, the resulting Huffman codes from the Huffman tree are typically abandoned because the encoder and the decoder will generate the same Huffman codes from the code length information. It would, therefore, be desirable if another approach for generating the code length information were available.

BRIEF DESCRIPTION OF THE DRAWINGS

The subject matter regarded as the invention is particularly pointed out and distinctly claimed in the concluding portion of this specification. The invention, however, both as to organization and method of operation, together with objects, features, and advantages thereof, may best be understood by reference to the following detailed description when read with the accompanying drawings in which:

FIG. 1 is a table illustrating a set of symbols with their corresponding frequency to which an embodiment in accordance with the present invention may be applied;

FIG. 2 is a table illustrating a first portion of an embodiment in accordance with the present invention, after initialization for the data shown in FIG. 1;

FIG. 3 is a table illustrating a second portion of an embodiment of the present invention, after initialization for the data shown on FIG. 2;

FIG. 4 is the table of FIG. 2, after a first merging operation has been applied;

FIG. 5 is the table of FIG. 3, after a first merging operation has been applied;

FIG. 6 is the table of FIG. 5, after the merging operations have been completed; and FIG. 7 is the table of FIG. 4, after the merging operations have been completed.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously described, Huffman codes for a set of symbols are generated based, at least in part, on the probability of occurrence of the source symbols. Accordingly, a binary tree, commonly referred to as a Huffman tree, is generated to extract the binary code and the code length. For example, in one application for text compression standards, such as GZIP, although, of course, the invention is limited in scope to this particular application, the Huffman tree information is passed from encoder to decoder in terms of a set of code lengths with the compressed text data. Both the encoder and decoder generate a unique Huffman code based on the code length information. However, generating the length information for the Huffman codes by constructing the corresponding Huffman tree is inefficient and often redundant. After the Huffman codes are produced from the Huffman tree, the codes are abandoned because the encoder and decoder will generate the Huffman codes based on the length information. Therefore, it would be desirable if the length information could be determined without producing a Huffman tree.

One embodiment, in accordance with the invention of a method of generating code lengths, for codes to be encoded, using a data structure, is provided. In this particular embodiment, the data structure is sorted, symbols in the data structure are combined, and symbol length is updated based, at least in part, on the frequency of the symbols being coded. In this particular embodiment, the data structure aides in the extraction of lengths of Huffman codes from a group of symbols without generating a Huffman tree where the probability of occurrence of the symbols is known. Although the invention is not limited in scope to this particular embodiment, experimental results show efficiency both in terms of computation and usage of memory suitable for both software and hardware implementation.

FIG. 1 is a table illustrating a set of symbols with their corresponding frequency, although, of course, this is provided simply as an alternative example. An embodiment of a method of generating code lengths in accordance with the present invention may be applied to this set of symbols. FIG. 1 illustrates a set of 18 symbols, although of course the invention is not limited in scope in this respect. In this particular example, although, again, the invention is not limited in scope in this respect, inspection of the frequency information reveals two symbols, index no. 7 and 13 of the shaded regions in FIG. 1, do not occur in this symbol set. Therefore, these symbols need not be considered for Huffman coding. In this particular embodiment, symbols having a zero frequency are omitted, although the invention is not restricted in scope in this respect.

In this particular embodiment, although, again, the invention is not limited in scope in this respect, the data structure to be employed has at least two portions. As has previously been indicated, it is noted that the invention is not restricted in scope to this particular data structure. Clearly, many modifications to this particular data structure may be made and still remain within the spirit and scope of what has been described. For this embodiment, however, one portion is illustrated in FIG. 2. This portion of the data structure tracks or stores the index and length information for each non-zero frequency symbol. As illustrated in FIG. 2, this portion is initialized with zero length in descending order in terms of frequency and symbol index. Of course, other embodiments are applicable, such as using ascending order, for example. FIG. 2 illustrates this first portion of an embodiment applied to the symbols of FIG. 1.

As illustrated, FIG. 2 includes 16 entries, zero to 15, corresponding to the 16 non-zero frequency symbols. In this particular data structure, although the invention is not limited in scope in this respect, the first field or column shows the associated symbol indices after the previously described sorting operation. The symbol frequency information illustrated in FIG. 2 is not part of the data structure, but is provided here merely for illustration purposes. It illustrates the descending order of the symbols in terms of frequency, in this example. The second field or column of the data structure, although, again, the invention is not limited in scope in this respect or to this particular embodiment, contains the length information for each symbol and is initialized to zero.

The second part or portion of the data structure for this particular embodiment, after initialization using the data or symbols in FIG. 2, is shown or illustrated in FIG. 3. In this particular embodiment, the first field of this portion of the data structure, that is the portion illustrated in FIG. 3, contains the frequency for the group. The second field for this particular embodiment contains bit flags. The bit flags correspond to or indicate the entry number of the symbols belonging to the group. For example, as illustrated in FIG. 3, the shaded area contains a symbol with entry no. 3. For this particular symbol, the group frequency is 3 and the bit flags are set to:

| bit number: | (15 - - - 3210) |
|---|---|
| bit value: | 0000 0000 0000 1000 | that is, bit number 3 is set to "1" in this example, while the remaining bits are set to "0".

As previously described, initially, the symbol to be coded is assigned a different bit flag for each symbol. Again, in this particular embodiment, although the invention is, again, not limited in scope in this respect, the code length initially comprises zero for each symbol. As shall be described in more detail hereinafter, in this particular embodiment, with the data structure initialized, symbol flags are combined beginning with the smallest frequency symbols. The symbols are then resorted and frequency information is updated to reflect the combination. These operations of combining signal flags and resorting are then repeated until no more symbols remain to be combined.

As previously described, the process is begun by initializing the data structure, such as the embodiment previously described, and setting a "counter" designated here "no_of_group", to the number of non-zero frequency symbols, here 16. Next, while this "counter," that is, no_of_group, is greater than one, the following operations are performed.

```
Begin
    1: Initialize the data structure (both parts I and II) as described
       above, and set the no_of_group to the number of non-zero
       frequency symbols.
    2: while (no_of_group > 1){
            2.1:    Merge the last two groups in the data structure of
                    part II, and insert it back into the list.
                    /* The merge operation for the group frequency is
                    simply add them together, and the merge operation
                    for the second field is simply bit-wise "OR"
                    operation. Both are very easy to implement in
                    term of software and hardware. FIG. 5 shows as
                    an example for this step. As we can see the last
                    two groups are merged and insert backed into the
                    list (shown in shading area). Since we are always
                    merging two groups into one, the memory can be
                    reused and we do not need to dynamically allocate
                    any new memory after initialization */
            2.2:    Update the length information in the data structure
                    of part I.
                    /* This step is done by scanning the "1"
                    bits in the merged bit- flags (second field in the
                    data structure of part II), and increases the Length
                    information by one in the corresponding entries in
                    the data structure. FIG. 4 shows the updates after
                    the merge-step shown in FIG. 5. */
            2.3:    Reduce no_of_group by one.
       } /* end of while */
End
```

As illustrated in FIG. 5, for example, the last two "groups" or "rows" in the second part or portion of the data structure are combined or merged and, as illustrated in FIG. 5, this portion of the data structure is resorted, that is, the combined symbols are sorted in the data structure appropriately based upon group frequency, in this particular embodiment.

It is likewise noted, although the invention is not limited in scope in this respect, that the merger or combining operation for the group frequency may be implemented in this particular embodiment by simply adding the frequencies together and a merger/combining operation for the second field of the data structure for this particular embodiment may be implemented as a "bitwise" logical OR operation. This provides advantages in terms of implementation in software and/or hardware. Another advantage of this particular embodiment is efficient use of memory, in addition to the ease of implementation of operations, such as summing and logical OR operations.

As previously described, a combining or merge operation results in two "groups" or "rows" being combined into one. Therefore, memory that has been allocated may be reused and the dynamic allocation of new memory after initialization is either reduced or avoided.

Next, the length information in the first portion or part of the data structure for this particular embodiment is updated to reflect the previous merging or combining operation. This is illustrated, for example, for this particular embodiment, in FIG. 4. One way to implement this operation, although the invention is not restricted in scope in this respect, is by scanning the "one" bits of the merged bit flags. That is, in this particular embodiment, the second field in the second portion of the data structure, is scanned and length information is increased or augmented by one in the corresponding entries in the first portion or part of the data structure.

Next the "counter" that is here, no_of_group, is reduced by one. The previous operations are repeated until the counter reaches the value one in this particular embodiment.

It should be noted that for this particular embodiment, once the "counter" reaches one, as illustrated in FIG. 6, there should be one group or row in the second portion of the data structure with a group frequency equal to the total group frequency and all bits in the bit flags should be set to one. However, likewise, FIG. 7 shows the final results of the code length information where this has occurred. Therefore, as illustrated in FIG. 7, the desired code length information is obtained.

As previously described, for this particular embodiment of a method of generating code length information, several advantages exist. As previously discussed, in comparison, for example, with generating the Huffman tree, memory usage is reduced and the dynamic allocation of memory may be avoided or the amount of memory to be dynamically allocated is reduced. Likewise, computational complexity is reduced.

Likewise, as previously described, operations employed to implement the previously described embodiment are relatively easy to implement in hardware or software, although the invention is not limited in scope to those embodiments in these particular operations. Thus, Huffman code length information may be extracted or produced without generating a Huffman tree.

In an alternative embodiment in accordance with the present invention, a method of encoding symbols may comprise encoding symbols using code length information; and generating the code length information without using a Huffman tree, such as, for example, using the embodiment previously described for generating code length information, although the invention is, of course, not limited in scope to the previous embodiment. It is, of course, understood in this context, that the length information is employed to encode symbols where the length information is generated from a Huffman code. Likewise, in another alternative embodiment in accordance with the present invention, a method of decoding symbols may comprise decoding symbols, wherein the symbols have been encoded using code length information and the code length information was generated without using a Huffman tree. It is, again, understood in this context, that the length information employed to encode symbols is generated from a Huffman code. Again, one approach to generate the code length information comprises the previously described embodiment.

It will, of course, be understood that, although particular embodiments have just been described, the invention is not limited in scope to a particular embodiment or implementation. For example, one embodiment may be in hardware, whereas another embodiment may be in software. Likewise, an embodiment may be in firmware, or any combination of hardware, software, or firmware, for example. Likewise, although the invention is not limited in scope in this respect, one embodiment may comprise an article, such as a storage medium. Such a storage medium, such as, for example, a CD-ROM, or a disk, may have stored thereon instructions, which when executed by a system, such as a computer system or platform, or an imaging system, may result in an embodiment of a method in accordance with the present invention being executed, such as a method of generating Huffman code length information, for example, as previously described. Likewise, embodiments of a method of initializing a data structure, encoding symbols, and/or decoding symbols, in accordance with the present invention, may be executed.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

The invention claimed is:

1. A method of generating code lengths, comprising:
   generating a data structure of symbol information, the data structure having a first portion comprising entries of symbol indices and corresponding symbol lengths, and a second portion comprising groups of frequency information for each of the symbols in the first portion;
   until the symbols can no longer be combined, iteratively:
      sorting the data structure;
      merging a plurality of groups in the data structure into a single group;
      inserting the merged group back into the data structure;
      removing the merged groups from the data structure; and
      updating the symbol lengths for the merged groups.

2. The method of claim 1, wherein said sorting comprises sorting the symbol indices by frequency of each symbol.

3. The method of claim 2, wherein the second portion additionally includes flags corresponding to each symbol.

4. The method of claim 3, wherein each flag comprises a bit flag to indicate a corresponding entry number of the symbols.

5. The method of claim 4, wherein said merging the group comprises merging the last two groups in the data structure, and said inserting the merged group back into the data structure comprises adding an entry into the data structure.

6. The method of claim 5, wherein the entry comprises
   a group frequency comprising the sum of the group frequency corresponding to the merged groups; and
   a corresponding bit flag comprising a bit-wise OR operation of the bit flags corresponding to the merged groups.

7. The method of claim 2, wherein said updating the symbol lengths for the merged groups comprises increasing the length for data structure entries corresponding to the merged groups.

8. An article of manufacture having stored thereon instructions, the instructions when executed by a computer, result in the following:

generating a data structure of symbol information, the data structure having a first portion comprising entries of symbol indices and corresponding symbol lengths, and a second portion comprising groups of frequency information for each of the symbols in the first portion;

until the symbols can no longer be combined, iteratively:
  sorting the data structure;
  merging a plurality of groups in the data structure into a single group;
  inserting the merged group back into the data structure;
  removing the merged groups from the data structure; and
  updating the symbol lengths for the merged groups.

9. The article of manufacture of claim 8, wherein said instructions that result in sorting comprises sorting the symbol indices by frequency of each symbol.

10. The article of manufacture of claim 8, wherein said instructions result in the second portion additionally including flags corresponding to each symbol.

11. The article of manufacture of claim 10, wherein said instructions result in each flag comprising a bit flag to indicate a corresponding entry number of the symbols.

12. The article of manufacture of claim 11, wherein said instructions that result in merging the group comprises merging the last two groups in the data structure, and said inserting the merged group back into the data structure comprises adding an entry into the data structure.

13. The article of manufacture of claim 12, wherein said instructions result in the entry comprising:
  a group frequency comprising the sum of the group frequency corresponding to the merged groups; and
  a corresponding bit flag comprising a bit-wise OR operation of the bit flags corresponding to the merged groups.

14. The article of manufacture of claim 8, wherein said instructions that result in updating the symbol length for the merged groups comprises increasing the length for data structure entries corresponding to the merged groups.

* * * * *